United States Patent
Cha et al.

(10) Patent No.: US 8,885,238 B2
(45) Date of Patent: Nov. 11, 2014

(54) LIGHT POSITION CONTROLLING APPARATUS AND METHOD OF MANUFACTURING THE SAME

(75) Inventors: Seung-nam Cha, Seoul (KR); Young-jun Park, Suwon-si (KR); Zhong Lin Wang, Atlanta, GA (US); Min-baek Lee, Hadong-gun (KR)

(73) Assignees: Samsung Electronics Co., Ltd., Suwon-si (KR); Georgia Tech Research Corporation, Atlanta, GA (US)

( * ) Notice: Subject to any disclaimer, the term of this patent is extended or adjusted under 35 U.S.C. 154(b) by 305 days.

(21) Appl. No.: 13/543,060

(22) Filed: Jul. 6, 2012

(65) Prior Publication Data

US 2013/0088764 A1 Apr. 11, 2013

(30) Foreign Application Priority Data

Oct. 11, 2011 (KR) .................... 10-2011-0103603

(51) Int. Cl.
| | | |
|---|---|---|
| *G02B 26/08* | (2006.01) | |
| *G02B 26/10* | (2006.01) | |
| *H01L 41/08* | (2006.01) | |
| *H01L 41/31* | (2013.01) | |

(52) U.S. Cl.
CPC .......... *H01L 41/082* (2013.01); *G02B 26/103* (2013.01); *H01L 41/31* (2013.01)
USPC ................................................ 359/197.1

(58) Field of Classification Search
CPC ........ G02B 26/103; G02B 26/10; G02B 6/10; G02B 6/107; G02B 6/00; G02B 6/0001; G02B 6/0011; H01L 41/082
USPC ........... 359/197.1, 202.1, 199.1, 200.6, 201.1
See application file for complete search history.

(56) References Cited

U.S. PATENT DOCUMENTS 8,503,054 B2 * 8/2013 Friese ...................... 359/202.1
2010/0202032 A1 8/2010 Friese

FOREIGN PATENT DOCUMENTS

| KR | 10-2006-0131828 A | 12/2006 |
|---|---|---|
| KR | 10-2010-0026324 A | 3/2010 |
| KR | 10-1008294 A | 1/2011 |

* cited by examiner

*Primary Examiner* — Euncha Cherry
(74) *Attorney, Agent, or Firm* — Sughrue Mion, PLLC (57) ABSTRACT

A light position controlling apparatus and a method of manufacturing the same. The light position controlling apparatus includes a substrate; first and second electrodes that are arranged on the substrate and configured to generate an electric field; and a piezoelectric nano wire configured to operate as optical waveguide. The piezoelectric nano wire includes a first portion disposed on the substrate, and a second portion that extends from the first portion and bends according to the electric field generated by the first and second electrodes to change a travel direction of light transmitted by the piezoelectric nano wire.

23 Claims, 6 Drawing Sheets

LIGHT POSITION CONTROLLING APPARATUS AND METHOD OF MANUFACTURING THE SAME

CROSS-REFERENCE TO RELATED APPLICATIONS

This application claims priority from Korean Patent Application No. 10-2011-0103603, filed on Oct. 11, 2011 in the Korean Intellectual Property Office, the disclosure of which is incorporated herein in its entirety by reference.

BACKGROUND

1. Field

The present disclosure relates to a light position controlling apparatus and a method of manufacturing the same, and more particularly, to a light position controlling apparatus that uses an optical waveguide and a method of manufacturing the light position controlling apparatus.

2. Description of the Related Art

In a general optical system, a travel direction of light is determined by the level of curvature of a lens surface or by controlling an incidence angle of the light incident to an optical mirror or a prism. In the optical system in which the lens, the optical mirror, the prism, and the like are used, a travel direction of a light signal is decided. In this regard, when the size of the optical system is reduced to a micro/nano scale, manufacturing costs and/or sizes of optical parts are limited, so that parts to replace them are required.

In order to actively control a direction of light, an optical mirror scanner, an optical coupler, and the like are generally used. Since the optical mirror scanner mechanically operates so as to control an optical path, the optical mirror scanner has a relatively large size. In a related art mechanical optical deflection devices including the optical mirror scanner, they are expensive and have limitations in device-integration and a continuous control of an optical path. Also, in a structure of an optical switch that electrically controls an optical path by using the optical coupler, it is difficult to perform a continuous control of the optical path.

SUMMARY

Exemplary embodiments provide a light position controlling apparatus that may actively control a travelling direction of light, that may be applied to a micro/nano scale optical system, and that uses an optical waveguide, and a method of manufacturing the light position controlling apparatus.

According to an aspect of an embodiment, there is provided a light position controlling apparatus including a substrate; first and second electrodes that are arranged on the substrate and configured to generate an electric field; and a piezoelectric nano wire configured to operate as optical waveguide, the piezoelectric nano wire including a first portion disposed on the substrate, and a second portion that extends from the first portion and bends according to the electric field generated by the first and second electrodes to change a travel direction of light transmitted by the piezoelectric nano wire.

The first and second portions of the piezoelectric nano wire may be formed of the same material.

A trench may be formed in a portion of the substrate corresponding to the second portion of the piezoelectric nano wire, so as to allow movement of the second portion of the piezoelectric nano wire.

The trench may be formed in at least a part of region between the first and second electrodes, whereby a start portion of the second portion extending from the first portion may be between the first and second electrodes.

A maximum width of the trench may be greater than a gap between the first and second electrodes.

The piezoelectric nano wire may be formed of a piezoelectric material capable of generating a strain in a direction vertical to an electric field, and an example of the piezoelectric material may include a material of which a piezoelectric coefficient d31 or d13 is not 0.

The piezoelectric nano wire may be formed of at least one material selected from the group consisting of ZnO, $LiNbO_3$, PVDF, and quartz.

The first and second electrodes may be separated from each other in a horizontal direction or a vertical direction of the substrate so as to allow a length of the piezoelectric nano wire to be partially positioned therebetween.

A material layer having a refractive index lower than a refractive index of the piezoelectric nano wire may be formed between the substrate and the first portion of the piezoelectric nano wire.

An optical apparatus including the light position controlling apparatus may be one of an optical switch, a micro optical calculation/distributor, and a micro optical scanner.

According to an aspect of another embodiment, there is provided a method of manufacturing a light position controlling apparatus, the method including forming first and second electrodes on a substrate, wherein the first and second electrodes are separated from each other and are configured to generate an external electric field; and forming a piezoelectric nano wire that is configured to operate as an optical waveguide, the piezoelectric nano wire including a first portion disposed on the substrate, and a second portion that extends from the first portion bends according to the electric field generated by the first and second electrodes to change a travel direction of light transmitted by the piezoelectric nano wire.

The method may further include forming a trench in the substrate prior to forming the piezoelectric nano wire, wherein the second portion of the piezoelectric nano wire is disposed above or in the trench, and a portion of the piezoelectric nano wire is disposed between the first and second electrodes.

After the trench is formed, the piezoelectric nano wire may be formed while a sacrificial material is filled in the trench, and after the piezoelectric nano wire is formed, the sacrificial material filled in the trench may be removed.

The trench may be formed in at least a part of region between the first and second electrodes, whereby a start portion of the second portion extending from the first portion may be between the first and second electrodes.

A maximum width of the trench may be greater than a gap between the first and second electrodes.

A material layer having a refractive index lower than a refractive index of the piezoelectric nano wire may be arranged between the substrate and the first portion of the piezoelectric nano wire.

BRIEF DESCRIPTION OF THE DRAWINGS

The and/or other aspects will become apparent and more readily appreciated from the following description of embodiments, taken in conjunction with the accompanying drawings in which.

DETAILED DESCRIPTION

Reference will now be made in detail to embodiments, examples of which are illustrated in the accompanying drawings.

Expressions such as "at least one of," when preceding a list of elements, modify the entire list of elements and do not modify the individual elements of the list.

In a case of semiconductor micro/nano wires, they may deliver a light signal having a specific wavelength due to a refractive index difference with the atmosphere. Also, in a case of a nano wire having a piezoelectric effect, a bend or a length of the nano wire may be changed by an external electric field.

A light position controlling apparatus according to one or more embodiments may be used as an optical waveguide by having a characteristic of a semiconductor micro/nano wire and simultaneously may control a travel direction of light by using a piezoelectric nano wire that has a piezoelectric effect and is bent by an external electric field.

Figure 1:
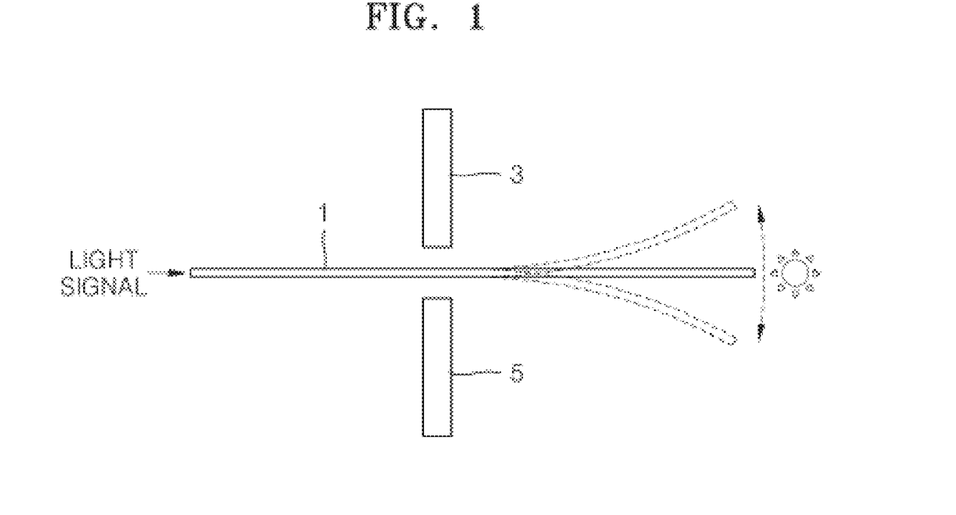
FIG. 1 illustrates a concept diagram of a light position controlling apparatus according to an embodiment.

FIG. 1 illustrates a concept diagram of a light position controlling apparatus according to an embodiment.

Referring to FIG. 1, a piezoelectric nano wire 1 is positioned between two electrodes 3 and 5 that may apply an electric field to the piezoelectric nano wire 1, and then a side of the piezoelectric nano wire 1, which is close to incidence of a light signal, is fixed. When the light signal is input at an end of the fixed side of the piezoelectric nano wire 1, light travels along the piezoelectric nano wire 1 and a portion of the other side of the piezoelectric nano wire 1, which is not fixed, may be bent in a specific direction along an external electric field occurring between the two electrodes 3 and 5. Accordingly, the travel direction of the light signal may be changed according to a direction in which the piezoelectric nano wire 1 is bent.

In this manner, when the piezoelectric nano wire 1, which is one-dimensional, is bent by an electrical signal, a final position of the light signal travelling in the piezoelectric nano wire 1 may be continuously changed in real-time. Also, when the piezoelectric nano wire 1 is applied to a nano device, since a bend or a length of the piezoelectric nano wire 1 is changed according to an electric field, the piezoelectric nano wire 1 may adjust a position of light in the nano device.

Figure 2:
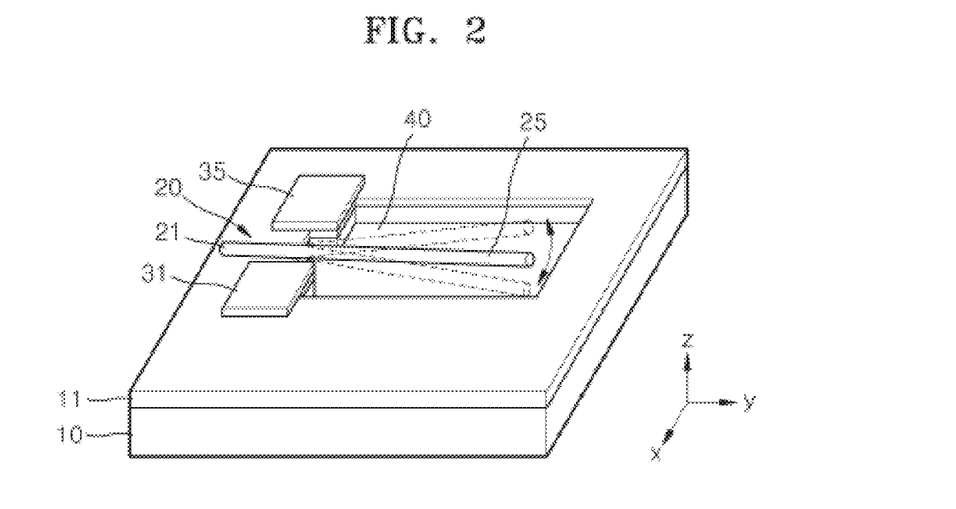
FIG. 2 is a perspective view of a light position controlling apparatus according to another embodiment.

FIG. 2 is a perspective view of a light position controlling apparatus according to an embodiment.

Referring to FIG. 2, the light position controlling apparatus may include a piezoelectric nano wire 20 having an end fixed to a substrate 10, and first and second electrodes 31 and 35 that are arranged on the substrate 10 so as to apply an external electric field to the piezoelectric nano wire 20.

The piezoelectric nano wire 20 includes a first portion 21 that is fixed to the substrate 10, and a second portion 25 that extends from the first portion 21 and is movable. The piezoelectric nano wire 20 may be configured to operate as an optical waveguide and change a travel direction of light in a manner that the second portion 25 that is movable according to the external electric field is bent.

In order for the piezoelectric nano wire 20 to operate as the optical waveguide and to simultaneously change its bend or direction according to the external electric field, the piezoelectric nano wire 20 may be formed of a piezoelectric material of which a piezoelectric coefficient d31 or d13 is not 0 and thus may generate a strain in a direction vertical to the external electric field. For example, the piezoelectric nano wire 20 may be formed of a material including at least one material selected from the group consisting of ZnO, LiNbO$_3$, PVDF, and quartz. The first portion 21 and the second portion 25 of the piezoelectric nano wire 20 may be formed of the same material. When the piezoelectric nano wire 20 is formed of a material including ZnO, the piezoelectric nano wire 20 has a refractive index of about 1.8, which is significantly greater than a refractive index of air, so that the light signal incident to the piezoelectric nano wire 20 may propagate through the optical waveguide formed as the piezoelectric nano wire 20.

In order to allow free movement of the second portion 25 of the piezoelectric nano wire 20, a trench 40 may be formed in a portion of the substrate 10 which corresponds to the second portion 25 of the piezoelectric nano wire 20 so that the second portion 25 of the piezoelectric nano wire 20 may be in or suspended above the trench 40 of the substrate 10 so that the second portion 25 does not contact the substrate 10. The trench 40 may be formed in at least a part of region between the first and second electrodes 31 and 35, so that a start portion of the second portion 25 extending from the first portion 21 may be between the first and second electrodes 31 and 35. Here, when the second portion 25 is bent, a movement width at the start portion of the second portion 25 is small but a movement width at an end portion of the second portion 25 is large. In this regard, in order for the trench 40 to sufficiently allow a movement width of the second portion 25, a maximum width of the trench 40 may be greater than a gap between the first and second electrodes 31 and 35. That is, as illustrated in FIG. 2, the trench 40 may be formed in a manner that a portion of the trench 40 between the first and second electrodes 31 and 35 has a relatively small width, and the other portion than the portion between the first and second electrodes 31 and 35 may have a relatively large width.

The light signal is input to an end of the first portion 21 of the piezoelectric nano wire 20, and in this regard, since the first portion 21 is fixed to the substrate 10, when there is a small difference between refractive indexes of the first portion 21 and a surrounding portion contacting the first portion 21, a great amount of optical loss may occur in the first portion 21. In consideration of the optical loss, the substrate 10 may be formed of a material having a refractive index lower than that of the piezoelectric nano wire 20, or a material layer 11 having a refractive index lower than that of the piezoelectric nano wire 20 may be arranged between the substrate 10 and the first portion 21 of the piezoelectric nano wire 20, so that the piezoelectric nano wire 20 may appropriately function as the optical waveguide.

FIG. 2 illustrates an example in which the material layer 11 is disposed on the substrate 10. The material layer 11 may be formed as an insulating layer so as to allow a circuit configuration of the light position controlling apparatus to be disposed on the substrate 10. For example, the material layer 11 may be formed as a layer including SiO$_2$ or SiN.

FIG. 2 illustrates the example in which the material layer 11 is formed on an entire region of the substrate 10 except for the trench 40. However, for example, the material layer 11 may be positioned only below the first portion 21 of the piezoelectric nano wire 20 or may be formed only on necessary regions.

The first and second electrodes 31 and 35 may be separated from each other so as to allow a length of the piezoelectric nano wire 20 to be partially positioned therebetween in at least one direction of a horizontal direction and a vertical direction of the substrate 10, and to apply the external electric field to the piezoelectric nano wire 20. For example, the first and second electrodes 31 and 35 may be formed of a metal material including Au, Ti, or the like. The first and second electrodes 31 and 35 may be formed of a plurality of types of metal materials, and/or may have a multi-layer structure.

FIG. 2 illustrates the example in which the first and second electrodes 31 and 35 are separated from each other in the horizontal direction of the substrate 10.

Alternatively, the first and second electrodes 31 and 35 may be separated from each other in the vertical direction of the substrate 10, and in this case, it is necessary for the piezoelectric nano wire 20 to pass through a gap between the first and second electrodes 31 and 35, so that the first electrode 31 is formed on the substrate 10, and then a dielectric material layer (not shown) capable of transferring an electric field to the first electrode 31, the piezoelectric nano wire 20, another dielectric material layer, and the second electrode 35 may be sequentially formed thereon.

Figure 3:
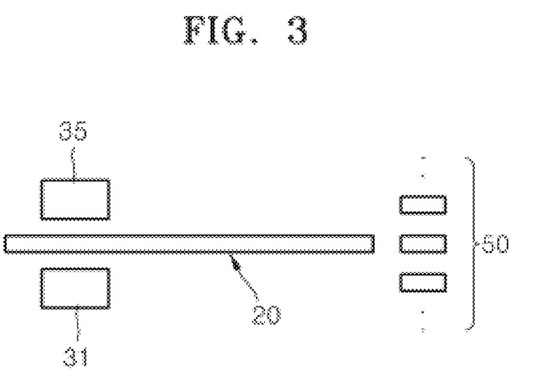
FIG. 3 illustrates an example of an optical apparatus applying the light position controlling apparatus, according to an embodiment.

FIG. 3 illustrates an example of an optical apparatus applying the light position controlling apparatus, according to an embodiment.

Referring to FIG. 3, the optical apparatus may be arranged in a manner that an array of optical devices 50 is disposed near an output end of the second portion 25 of the piezoelectric nano wire 20 so as to receive light delivered via the piezoelectric nano wire 20. Here, in a case where the optical devices 50 are each disposed as an optical sensor, an optical waveguide such as an optical fiber, or the like, the optical apparatus may correspond to an optical switch, a micro optical calculation/distributor, or the like. Also, instead of the array of optical devices 50, when a scanning surface is disposed, it is possible to continuously change a bending direction of the piezoelectric nano wire 20, so that the optical apparatus may be embodied as a micro optical scanner capable of performing one-dimensional scanning FIG. 4 schematically illustrates another example of an optical apparatus applying the light position controlling apparatus, according to an embodiment.

Figure 4:
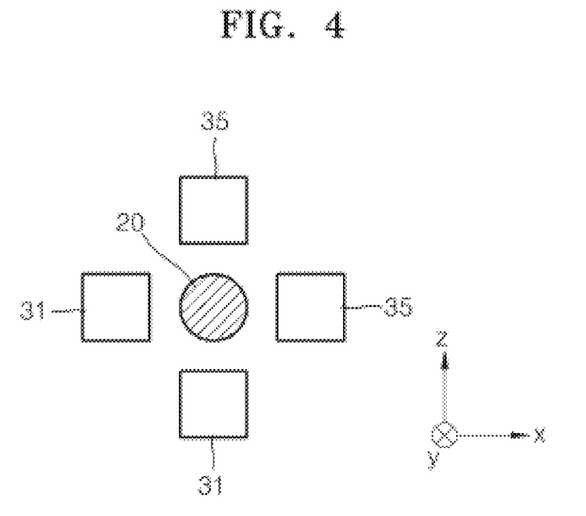
FIG. 4 illustrates another example of an optical apparatus applying the light position controlling apparatus, according to an embodiment.

Referring to FIG. 4, when the first and second electrodes 31 and 35 are disposed both in a horizontal direction (an X-axis direction) and a vertical direction (a Z-axis direction) of the substrate 10, a bending direction of the piezoelectric nano wire 20 may be continuously changed in up, down, right, or left directions, so that the optical apparatus may be embodied as a micro optical scanner capable of scanning light on a two-dimensional surface. In an example of FIG. 4, a dielectric layer (not shown) capable of delivering an electric field may be formed above and below the piezoelectric nano wire 20 between the first and second electrodes 31 and 35 that are positioned in the vertical direction (the Z-axis direction) of the substrate 10.

Hereinafter, a method of manufacturing a light position controlling apparatus, according to an embodiment, will be described. In this regard, the method will be described with regards to the light position controlling apparatus of FIG. 2.

Figure 5A:
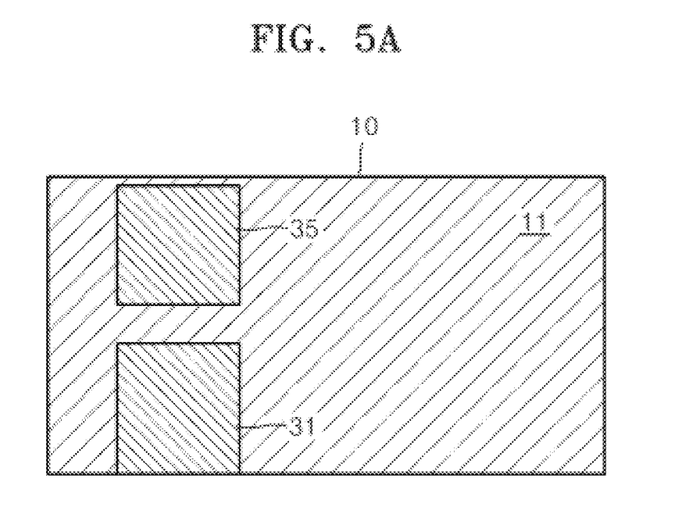
FIGS. 5A, 5B, 6A, 6B, 7A and 7B illustrate a method of manufacturing a light position controlling apparatus, according to an embodiment.
Figure 5B:
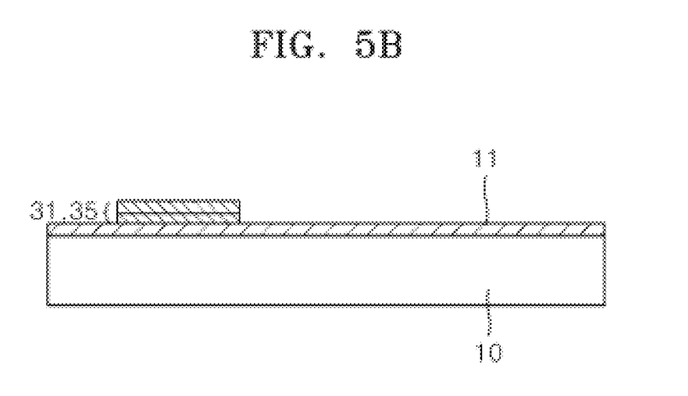

Referring to FIG. 5A and FIG. 5B, which is a cross-sectional view of FIG. 5A, the first and second electrodes 31 and 35 are formed separately on the substrate 10 so as to apply an external electric field. The material layer 11 having a smaller refractive index than that of the piezoelectric nano wire 20 to be formed may be formed on the substrate 10. The material layer 11 may be formed as an insulating layer including $SiO_2$ or SiN. The first and second electrodes 31 and 35 may be formed by using a one type or a plurality of types of metal materials including Au, Ti, or the like, and may have a single-layer structure or a multi-layer structure.

Figure 6A:
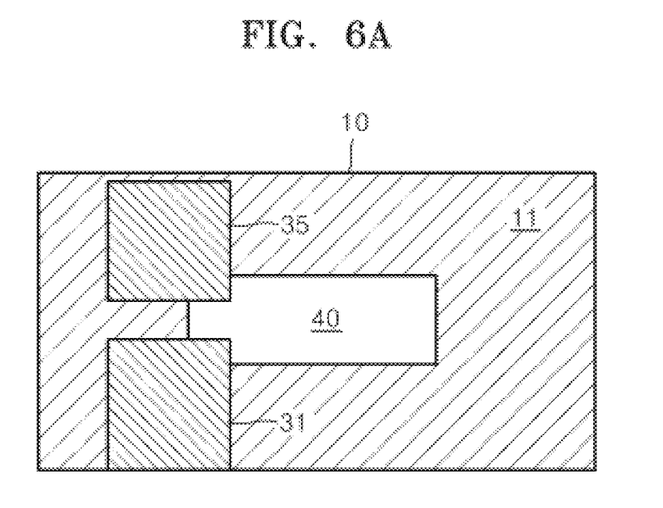
Figure 6B:
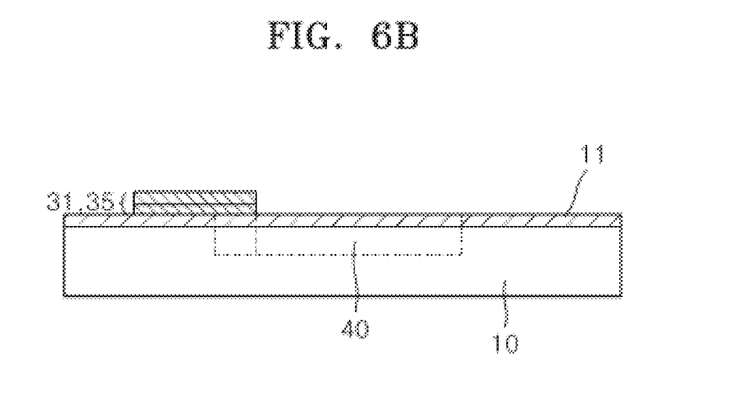

Next, referring to FIG. 6A and FIG. 6B, which is a cross-sectional view of FIG. 6A, the trench 40 is formed on the substrate 10. The trench 40 is formed in at least a part of region between the first and second electrodes 31 and 35, so that a start portion of the second portion 25 extending from the first portion 21 of the piezoelectric nano wire 20 may be between the first and second electrodes 31 and 35. Here, as described above, a maximum width of the trench 40 may be greater than a gap between the first and second electrodes 31 and 35. The trench 40 may be formed in a manner that a portion of the trench 40 between the first and second electrodes 31 and 35 has a relatively small width, and the other portion than the portion between the first and second electrodes 31 and 35 may have a relatively large width.

Alternatively, the first and second electrodes 31 and 35 may be formed after the trench 40 is formed in the substrate 10.

Figure 7A:
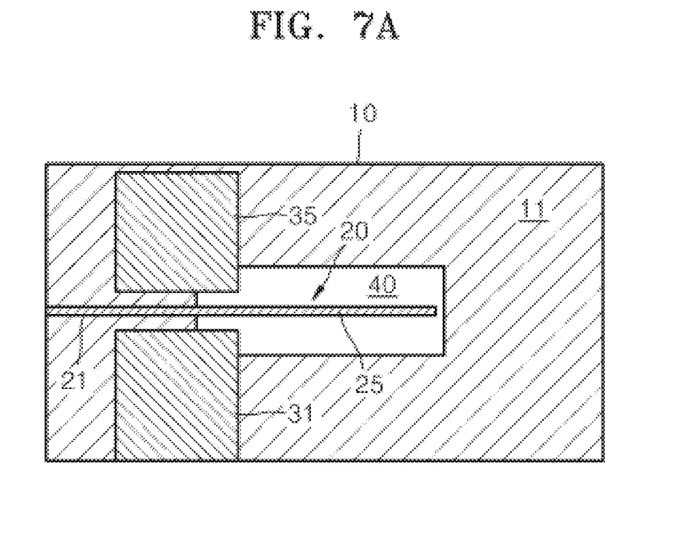
Figure 7B:
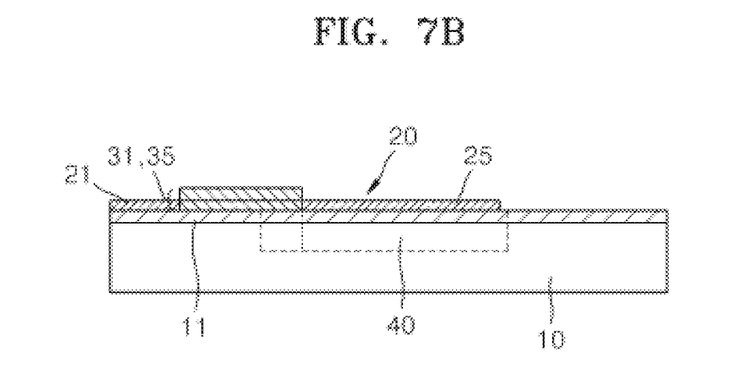

Next, referring to FIG. 7A and FIG. 7B, which is a cross-sectional view of FIG. 7A, the piezoelectric nano wire 20 is formed on the substrate 10 so that at least a portion of the piezoelectric nano wire 20 is positioned between the first and second electrodes 31 and 35. The piezoelectric nano wire 20 may be formed in a manner that, after the trench 40 is formed, the piezoelectric nano wire 20 is formed while a sacrificial material is filled in the trench 40, and then the sacrificial material is removed after the piezoelectric nano wire 20 is formed. By doing as so, it is possible to form the piezoelectric nano wire 20 including the first portion 21 fixed to the substrate 10, and the second portion 25 extending from the first portion 21 in the trench 40 and being movable.

In a case of forming the first and second electrodes 31 and 35 in a vertical direction of the substrate 10, the first electrode 31 is formed, the piezoelectric nano wire 20 is formed, and then the second electrode 35 is formed such that the first electrode 31, the piezoelectric nano wire 20, and the second electrode 35 are sequentially formed in the vertical direction. Here, dielectric layers capable of delivering an electric field may be formed between the first electrode 31 and the first portion 21 of the piezoelectric nano wire 20, and between the first portion 21 of the piezoelectric nano wire 20 and the second electrode 35, respectively.

In a case of forming the first and second electrodes 31 and 35, which are separated from each other, both in a horizontal direction and a vertical direction of the substrate 10 so as to allow at least a portion of the piezoelectric nano wire 20 to be therebetween, the first electrode 31 may be formed in the vertical direction, the first and second electrodes 31 and 35 that are disposed in the horizontal direction with respect to the piezoelectric nano wire 20 may be formed, and then the second electrode 35 may be formed in the vertical direction.

FIGS. 5B, 6B and 7B indicate the first and second electrodes 31 and 35 having double layer structure as an example.

Figure 8:
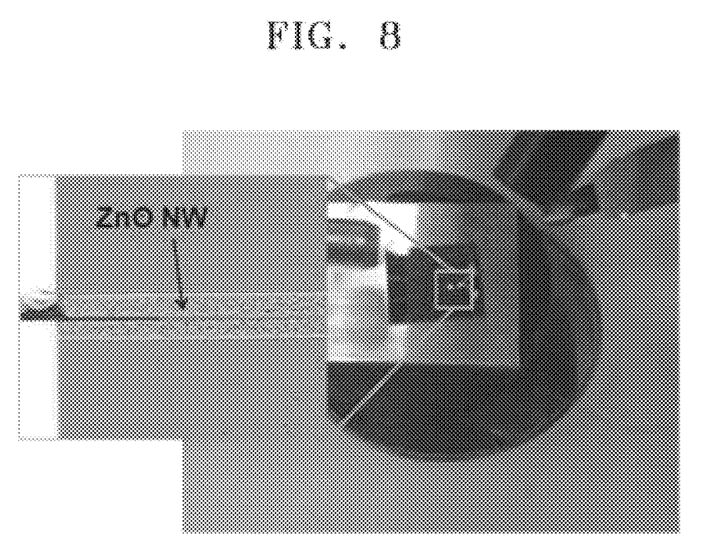
FIG. 8 illustrates a test conducted by using a zinc oxide piezoelectric nano wire so as to show that a piezoelectric nano wire that is applied to the light position controlling apparatus according to an embodiment of the present invention functions as an optical waveguide.

The light position controlling apparatus and the method of manufacturing the same, according to the one or more embodiments, may vary, and their various embodiments may be sufficiently derived from the aforementioned descriptions. Thus, further illustrations and detailed descriptions thereof are omitted here. FIG. 8 illustrates a test conducted by using a zinc oxide piezoelectric nano wire (ZnO NW) so as to show that the piezoelectric nano wire 20 that is applied to the light position controlling apparatus according to an embodiment of the present invention functions as an optical waveguide.

In the test of FIG. 8, a left image was captured by using an optical microscope and shows the ZnO NW. The test was conducted in a manner that, after an optical fiber is fixed to one end of the ZnO NW, a light signal is delivered to one end and then the other end was observed. As shown in a right optical-image of FIG. 8, it is possible to see that the delivered light signal is observed at the other end.

According to an embodiment of the light position controlling apparatus that uses the piezoelectric nano wire 20, unlike a method of changing a direction of light by moving an optical lens, a position of the light signal may be changed by changing an electric field in real-time. According to the light position controlling apparatus, it is possible to analoguely control a position of the piezoelectric nano wire 20, which functions as the optical waveguide, by using a piezoelectric effect. Thus, the light position controlling apparatus may be used as an optical scanner, may replace a general on-off digital optical switch, or may be used as a continuous switch. Also, by continuously adjusting a bending of the piezoelectric nano wire 20, it is possible to continuously control a position of the light signal to a specifically desired position, so that the light position controlling apparatus may be used as an analog switch.

According to an embodiment of the light position controlling apparatus, the piezoelectric nano wire functions as the optical waveguide, and its bending direction may be adjusted due to the external electric field applied thereto. In this regard, an end of the piezoelectric nano wire is fixed to the substrate, and the other end of the piezoelectric nano wire is movable, so that the travel direction of light may be actively controlled.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A light position controlling apparatus comprising:
   a substrate;
   first and second electrodes that are arranged on the substrate and configured to generate an electric field; and
   a piezoelectric nano wire configured to operate as optical waveguide, the piezoelectric nano wire comprising a first portion disposed on the substrate, and a second portion that extends from the first portion and bends according to the electric field generated by the first and second electrodes to change a travel direction of light transmitted by the piezoelectric nano wire.

2. The light position controlling apparatus of claim 1, wherein the first and second portions of the piezoelectric nano wire are formed of a same material.

3. The light position controlling apparatus of claim 1, wherein a trench is formed in a portion of the substrate corresponding to the second portion of the piezoelectric nano wire, so as to allow movement of the second portion of the piezoelectric nano wire.

4. The light position controlling apparatus of claim 3, wherein the trench is formed in at least a part of region between the first and second electrodes, whereby a portion of the second portion of the piezoelectric nano wire is between the first and second electrodes.

5. The light position controlling apparatus of claim 3, wherein a maximum width of the trench is greater than a gap between the first and second electrodes.

6. The light position controlling apparatus of claim 1, wherein the piezoelectric nano wire is formed of a piezoelectric material capable of generating a strain in a direction vertical to an electric field.

7. The light position controlling apparatus of claim 6, wherein the piezoelectric nano wire is formed of a material of which a piezoelectric coefficient d31 or d13 is not 0.

8. The light position controlling apparatus of claim 6, wherein the piezoelectric nano wire is formed of at least one material selected from the group consisting of ZnO, $LiNbO_3$, PVDF, and quartz.

9. The light position controlling apparatus of claim 1, wherein the first and second electrodes are separated from each other in a horizontal direction or a vertical direction of the substrate, and a portion of the piezoelectric nano wire is positioned between the first and second electrodes.

10. The light position controlling apparatus of claim 1, further comprising a material layer disposed on the substrate and interposed between the substrate and the first portion of the piezoelectric nano wire, the material layer having a refractive index lower than a refractive index of the piezoelectric nano wire.

11. An optical apparatus comprising the light position controlling apparatus of claim 1.

12. The optical apparatus of claim 11, wherein the optical apparatus is one of an optical switch, a micro optical calculation/distributor, and a micro optical scanner.

13. A method of manufacturing a light position controlling apparatus, the method comprising:
    forming first and second electrodes on a substrate, wherein the first and second electrodes are separated from each other and are configured to generate an external electric field; and
    forming a piezoelectric nano wire that is configured to operate as an optical waveguide, the piezoelectric nano wire comprising a first portion disposed on the substrate, and a second portion that extends from the first portion bends according to the electric field generated by the first and second electrodes to change a travel direction of light transmitted by the piezoelectric nano wire.

14. The method of claim 13, wherein the first and second portions of the piezoelectric nano wire are formed of the same material.

15. The method of claim 13, further comprising forming a trench in the substrate prior to forming the piezoelectric nano wire, wherein the second portion of the piezoelectric nano wire is disposed above or in the trench, and a portion of the piezoelectric nano wire is disposed between the first and second electrodes.

16. The method of claim 15, further comprising:
    after the trench is formed, filling the trench with a sacrificial material, wherein the piezoelectric nano wire is formed while the sacrificial material is in the trench, and
    after the piezoelectric nano wire is formed, removing the sacrificial material in the trench.

17. The method of claim 15, wherein the trench is formed in at least a part of region between the first and second electrodes, whereby a portion of the second portion extending from the first portion is between the first and second electrodes.

18. The method of claim 17, wherein a maximum width of the trench is greater than a gap between the first and second electrodes.

19. The method of claim 13, wherein the piezoelectric nano wire is formed of a piezoelectric material capable of generating a strain in a direction vertical to an electric field.

20. The method of claim 19, wherein the piezoelectric nano wire is formed of a material of which a piezoelectric coefficient $d_{31}$ or $d_{13}$ is not 0.

21. The method of claim 19, wherein the piezoelectric nano wire is formed of at least one material selected from the group consisting of ZnO, LiNbO3, PVDF, and quartz.

22. The method of claim 13, wherein the first and second electrodes are separated from each other in at least one direction of a horizontal direction and a vertical direction of the substrate, and a portion of the piezoelectric nano wire is positioned between the first and second electrodes.

23. The method of claim 13, wherein a material layer having a refractive index lower than a refractive index of the piezoelectric nano wire is arranged between the substrate and the first portion of the piezoelectric nano wire.

* * * * *